United States Patent
Ashikhmin

(10) Patent No.: US 9,944,520 B2
(45) Date of Patent: Apr. 17, 2018

(54) SYNDROME OF DEGRADED QUANTUM REDUNDANCY CODED STATES

(71) Applicant: Alcatel-Lucent USA Inc., Murray Hill, NJ (US)

(72) Inventor: Alexei Ashikhmin, Morristown, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 657 days.

(21) Appl. No.: 13/912,876

(22) Filed: Jun. 7, 2013

(65) Prior Publication Data
US 2014/0201591 A1    Jul. 17, 2014

Related U.S. Application Data

(60) Provisional application No. 61/752,646, filed on Jan. 15, 2013.

(51) Int. Cl.
*B82Y 10/00*    (2011.01)
*G06N 99/00*    (2010.01)
*H03M 13/13*    (2006.01)

(52) U.S. Cl.
CPC ............ *B82Y 10/00* (2013.01); *G06N 99/002* (2013.01); *H03M 13/13* (2013.01)

(58) Field of Classification Search
CPC ...... B82Y 10/00; H03M 13/13; G06N 99/002
USPC ....................................................... 714/784
See application file for complete search history.

(56) References Cited

U.S. PATENT DOCUMENTS

| 6,081,882 | A  | * | 6/2000  | Gossett ............................ 712/1 |
| 6,128,764 | A  |   | 10/2000 | Gottesman |
| 6,301,029 | B1 | * | 10/2001 | Azuma ........................ 359/107 |
| 7,251,769 | B2 |   | 7/2007  | Ashikhmin et al. |
| 7,373,581 | B2 |   | 5/2008  | Okamura et al. |
| 7,519,898 | B2 |   | 4/2009  | Narayanan et al. |
| 7,583,438 | B2 |   | 9/2009  | Tomita |
| 7,676,734 | B2 |   | 3/2010  | Yamagishi |
| 7,732,804 | B2 |   | 6/2010  | Hollenberg et al. |

(Continued)

FOREIGN PATENT DOCUMENTS

| CN | 1825771 A    | 8/2006  |
| JP | 2006-345324 A | 12/2006 |
| JP | 2010-233066 A | 10/2010 |

OTHER PUBLICATIONS

Decoding methods—Wikipedia, the free encyclopedia, http://en.wikipedia.org/wiki/Decoding_methods, May 1, 2012, 5 pgs.

(Continued)

*Primary Examiner* — Joseph D Torres
(74) *Attorney, Agent, or Firm* — John F. McCabe

(57) ABSTRACT

An apparatus includes a device having n input ports and n output ports. The n input ports are configured to receive n corresponding physical objects of a physically processed, quantum redundancy coded state. The n output ports are configured to output the n physical objects in the physically processed, quantum redundancy coded state. The device is configured to measure bits of a syndrome of the physically processed, quantum redundancy coded state by passing the n physical objects through the device. The device is configured to measure a parity check bit for the measured bits of the syndrome by the passing the n physical objects through the device.

5 Claims, 10 Drawing Sheets

(56) References Cited

U.S. PATENT DOCUMENTS

| | | |
|---|---|---|
| 7,751,491 B2 | 7/2010 | Li et al. |
| 7,793,201 B1 | 9/2010 | Ulriksson |
| 7,805,654 B2 | 9/2010 | Seki |
| 7,875,876 B1 | 1/2011 | Wandzura et al. |
| 8,223,414 B2 | 7/2012 | Goto et al. |
| 8,327,215 B2 | 12/2012 | Yoon et al. |
| 2003/0093451 A1* | 5/2003 | Chuang et al. ............... 708/520 |
| 2004/0000666 A1 | 1/2004 | Lidar et al. |
| 2004/0024750 A1* | 2/2004 | Ulyanov et al. ............... 707/3 |
| 2006/0101236 A1 | 5/2006 | Han |
| 2007/0126436 A1 | 6/2007 | Hannah |
| 2008/0140746 A1* | 6/2008 | Papageorgiou et al. ...... 708/403 |
| 2008/0185576 A1 | 8/2008 | Hollenberg et al. |
| 2008/0237579 A1 | 10/2008 | Barker et al. |
| 2009/0213444 A1 | 8/2009 | Goto et al. |
| 2010/0251049 A1 | 9/2010 | Goto et al. |
| 2013/0088224 A1 | 4/2013 | Koizumi |
| 2013/0107617 A1 | 5/2013 | Skold et al. |

OTHER PUBLICATIONS

Quantum computer—Wikipedia, the free encyclopedia, http://en.wikipedia.org/wiki/Quantum_computer, Jan. 11, 2013, 24 pgs.
Quantum error correction—Wikipedia, the free encyclopedia, http://en.wikipedia.org/wiki/Quantum_error_correction, Nov. 20, 2012, 6 pgs.
Quantum gate—Wikipedia, the free encyclopedia, http://en.wikipedia.org/wiki/Quantum_gate, Jan. 13, 2013, 7 pgs.
Stabilizer code—Wikipedia, the free encyclopedia, http://en.wikipedia.org/wiki/Stabilizer_code, Nov. 26, 2012, 5 pgs.
Gaitan, Frank, Quantum Error Correction and Fault Tolerant Quantum Computing, CRC Press, 2008, Florida, pp. vii-292.
Nielsen, Michael A. et al., Quantum Computation and Quantum Information, Cambridge University Press, 2000, UK, pp. vii-676.
Gilbert, G. et al., "Logical Zeros for the Seven-Qubit Quantum Error Correction Code", Proceedings of SPIE, vol. 8057, Apr. 28, 2011, pp. 80570D-1 to 80570D-6.
Ching-Yi, Lai et al., "A construction of Quantum Stabilizer Codes Based on Syndrome Assignment by Classical Parity-Check Matrices", IEEE Transactions on Information Theory, vol. 57, No. 10, Oct. 2011, pp. 7163 to 7179.
Buttler, W. T. et al., "Fast, efficient error reconciliation for quantum cryptography", Physical Review A, vol. 67, No. 5, May 2003, pp. 52303-1 to 52303-8.
PCT International Search Report, International Application No. PCT/US2014/010276, dated Apr. 8, 2014, 4 pages.
Sklar, Bernard, Digital Communications Fundamentals and Applications, Title Page, Copyright page, Table of Contents and Chapter 5, PTR, Prentice Hall, Englewood Cliffs, New Jersey, 1988, 84 pgs.
Ashikhmin, A., U.S. Appl. No. 13/912,654, filed Jun. 7, 2013, "Error Correction for Entangled Quantum States", 34 pages.
Ruffer, B. S., et al., "On robust stability of the belief propagation algorithm for LDPC decoding," In Proc. 19th Int. Symp. Study of Mathematical Theory of Networks and Systems, 2010 [4], pp. 1-6.
Ezhov, A. A., et al., "Quantum associative memory with distributed queries", Information Sciences, vol. 128, Issues 3-4, Oct. 1, 2000, pp. 271-293, Retrieved from: (http://www.sciencedirect.com/science/article/pii/S0020025500000578).
Steane, A. M., et al., "Error Correcting codes in Quantum Theory", APS Journals, Physical Review Letters, vol. 77, No. 5, pp. 793-797 (1996).
Barenco, A., et al., "Elementary gates for quantum computation," APS Journals, Physical Review A, vol. 52, No. 5, Nov. 1995, pp. 3457-3467.
Preskill, J., "Reliable Quantum Computers," Proceeding from Royal Society A, London, 1998, vol. 454, pp. 385-410.
Muthukrishnan, A., "Classical and Quantum Logic Gates: An Introduction to Quantum Computing," Quantum Information Seminar, Rochester Center for Quantum Information, Sep. 1999, pp. 1-22.
Kielpinski, D., "A Small Trapped-Ion Quantum Register," Institute of Physics Publishing, Journal of Optics B: Quantum and Semiclassical Optics, vol. 5, 2003, R121-R135.
Van Meter III, R. D., "Architecture of a Quantum Multicomputer Optimized for Shor',s Factoring Algorithm," PhD dissertation, Keio Univ., 2006, pp. i-239.
Kok, P., et al., "Linear Optical Quantum Computing with Photonic Qubits," APS Journals, Reviews of Modern Physics, vol. 79, No. 1, pp. 135-174 (2007).
Li, R., et al., "Robust High-Fidelity Universal Set of Quantum Gates Through Non-Adiabatic Rapid Passage," Available online at: arXiv.org, arXiv:1101.3579v2 [quant-ph], (2011) pp. 1-8.
Valiron, B., "Quantum computation: a tutorial," New Generation Computing, 2012, pp. 1-30.
Wootton, J. R., "Quantum Memories and Error Correction," Tutorial Review, Journal of Modern Optics, vol. 59, No. 20, Nov. 2012, pp. 1717-1738.
Preskill, J., "Quantum Error Correction," Chapter 7, available online at: http://www.theory.caltech.edu/people/preskill/ph229/, 1999 (92 pages).
G. Gilbert et al., "Logical Zeros for the Seven-Qubit Quantum Error Correction Code", Proceeding of SPIE 8057, Quantum Information and Computation IX, 80570D, Jun. 2, 2011, vol. 8057, pp. 80570D-1 to 80570D-6.
Furuta, Kenichiro, "Quantum Error Correction Using Unitary Operator in Reflecting Syndrome to Correction", IEICE Technical Report IT 2004-37, Sep. 9, 2004, vol. 104, No. 301, pp. 31-36.
Ashikhmin, Alexei et al., "Robust Quantum Error Syndrome Extraction by Classical Coding", 2014 IEEE International Symposium on Information Theory, pp. 546-550.

* cited by examiner

SYNDROME OF DEGRADED QUANTUM REDUNDANCY CODED STATES

This application claims the benefit of U.S. provisional patent application No. 61/752,646, filed Jan. 15, 2013.

The U.S. Government has a paid-up license in this invention and the right in limited circumstances to require the patent owner to license others on reasonable terms as provided for by the terms of contract No. D11PC20165 awarded by the Intelligence Advanced Research Projects Activity (IARPA).

BACKGROUND

Technical Field

The inventions relate to measuring syndromes of quantum redundancy coded states, which may have undergone physical degradation.

Related Art

This section introduces aspects that may be helpful to facilitating a better understanding of the inventions. Accordingly, the statements of this section are to be read in this light and are not to be understood as admissions about what is in the prior art or what is not in the prior art.

Since information carrying entangled quantum states are susceptible to errors during some types of physical processing, error-correction will probably be used by quantum computers, in which such entangled quantum states carry information. In such quantum computers, the error-correction may involve quantum redundancy coding of the information carrying entangled quantum states based on quantum stabilizer groups.

Quantum redundancy coding involves coherently mixing the individual initial quantum states, i.e., information carrying states, with a preset quantum state thereby producing corresponding quantum redundancy coded states. The coherent mixing typically entangles each initial quantum state with a preset quantum state having multiple quantum bits (qubits). After quantum redundancy coding, physical processing may generate errors in the quantum redundancy coded states. The physical processing may include, e.g., transmission of the quantum redundancy coded states over a physical communication channel and/or storage of the quantum redundancy coded states.

After the physical processing, the physically processing processed quantum redundancy coded may be subjected to error-correction processing. The error-correction process typically involves measuring a value of the syndrome of a physically processed quantum redundancy coded state. The measured value of the syndrome is indicative of whether an error has been produced in the corresponding quantum redundancy coded state by the physical processing. Typically, the measured values are used to identify the errors, which are most probably produced by the physical processing. If the measured value of the syndrome indicates the presence of an error, the error-correction process may involve applying a quantum operation to the physically processed redundancy coded quantum state to invert the error most likely produced by said physical processing. The form of the applied quantum operation is determined from the syndrome of the physically processed quantum redundancy coded state. Usually, the set of errors correctable by such error-correction processing is a proper subset of the set of all errors that the physical processing can produce.

SUMMARY OF SOME EXAMPLES OF EMBODIMENTS

Some embodiments provide apparatus or methods whose determinations of the syndrome of a physically processed, e.g., degraded, quantum redundancy coded state are more robust against potential errors.

In some embodiments, a first apparatus includes a device having n input ports and n output ports. The n input ports are configured to receive n corresponding physical objects of a physically processed, quantum redundancy coded state. The n output ports are configured to output the n physical objects in the physically processed, quantum redundancy coded state. The device is configured to measure bits of a syndrome of the physically processed, quantum redundancy coded state by passing the n physical objects through the device. The device is configured to measure a parity check bit for some of the measured bits of the syndrome by the passing the n physical objects through the device.

In some embodiments of the first apparatus, the device may include a sequence of serially connected measurement devices. Each of the measurement devices is configured to receive and transmit the n physical objects and is configured to measure either one of the bits of the syndrome or the parity check bit for some of the measured bits of the syndrome. In some such embodiments, at least, one of the measurement devices is configured to measure the parity check bit. In any embodiments of this paragraph, each of the measurement devices may include a quantum circuit of quantum gates. In any embodiments of this paragraph, a proper subset of the measurement devices may be configured to measure the bits of the syndrome such that each bit of the syndrome is measured by a different one of the measurement devices of the proper subset.

Any of the above embodiments of the first apparatus may further include an electronic controller connected to receive the measured bits of the syndrome and the measured parity check bit. The electronic controller is configured to determine an error-corrected value of the syndrome based on the measured parity check bit and the measured bits of the syndrome. In some such embodiments, the controller may be configured to error correct the syndrome measured by the proper subset of the measurement devices according to a linear block code. In some such embodiments, the first apparatus may include an error-correction module configured to error-correct the physically processed, quantum redundancy coded state based on an error-corrected value of the syndrome produced by the electronic controller.

In other embodiments, a second apparatus includes an input register connected to receive and store a physical state of n qubits, a plurality of auxiliary registers, a quantum circuit, and a plurality of detectors. Each auxiliary register of the plurality is configured to transmit a preset state of one or more qubits. The quantum circuit is constructed to transform the preset states based on the physical state received from the input register and to output the physical state to an output register. Each detector of the plurality is connected to receive a corresponding one of the transformed preset states from the quantum circuit and is configured to produce a value by measuring one or more qubits of the corresponding received one of the transformed preset states. The quantum circuit is configured to form the transformed states such that the produced values measure bits of the syndrome of the physical state and such that at least one of the produced values measures a parity check bit for the measured bits of the syndrome.

Some embodiments of the second apparatus may further include a controller configured to receive the values from the detectors. The controller may also be configured to error-correct one of the produced values that measures a bit of the syndrome based on the value that measures a parity check bit. Some such embodiments may further include an error-correction module that is configured to receive the physical state from the output register and to error-correct the received the physical state based on an error-corrected value of the syndrome produced by the electronic controller.

In some embodiments of the second apparatus, the quantum circuit is configured to serially produce the transformed quantum states.

In some embodiments of the second apparatus, the quantum circuit is configured to transform, at least, two of the preset quantum states in parallel.

In another embodiment, a method includes transmitting a redundancy encoded multi-qubit state through a first hardware device to measure a syndrome of the redundancy encoded multi-qubit state. The method also includes transmitting the redundancy encoded multi-qubit state through a second hardware device to measure one or more parity check bits for the measurement of the syndrome.

In some embodiments of the method, the act of transmitting a redundancy encoded multi-qubit state through the first hardware device may include transmitting the redundancy encoded multi-qubit state through a sequence of quantum gate circuits. In some such embodiments, the act of transmitting a redundancy encoded multi-qubit state through the second hardware device may include transmitting the redundancy encoded multi-qubit state through a sequence of quantum gate circuits, wherein the first and second sequences are disjoint.

Any of the above embodiments of a method may further include error-correcting the measured syndrome by correcting, at least, one of a plurality of measured bits of the syndrome based on the measured value of the one or more parity check bits. Some such embodiments may further including error-correcting the redundancy encoded multi-qubit state in a quantum circuit based on the error-corrected measured syndrome.

Other embodiments may cover other apparatus or methods of operating apparatus as described in the summary of some examples of embodiments, the drawings, and/or the detailed description of illustrative embodiments.

BRIEF DESCRIPTION OF THE DRAWINGS

In the Figures and text like reference numbers refer to functionally and/or structurally similar elements.

Figure 1:
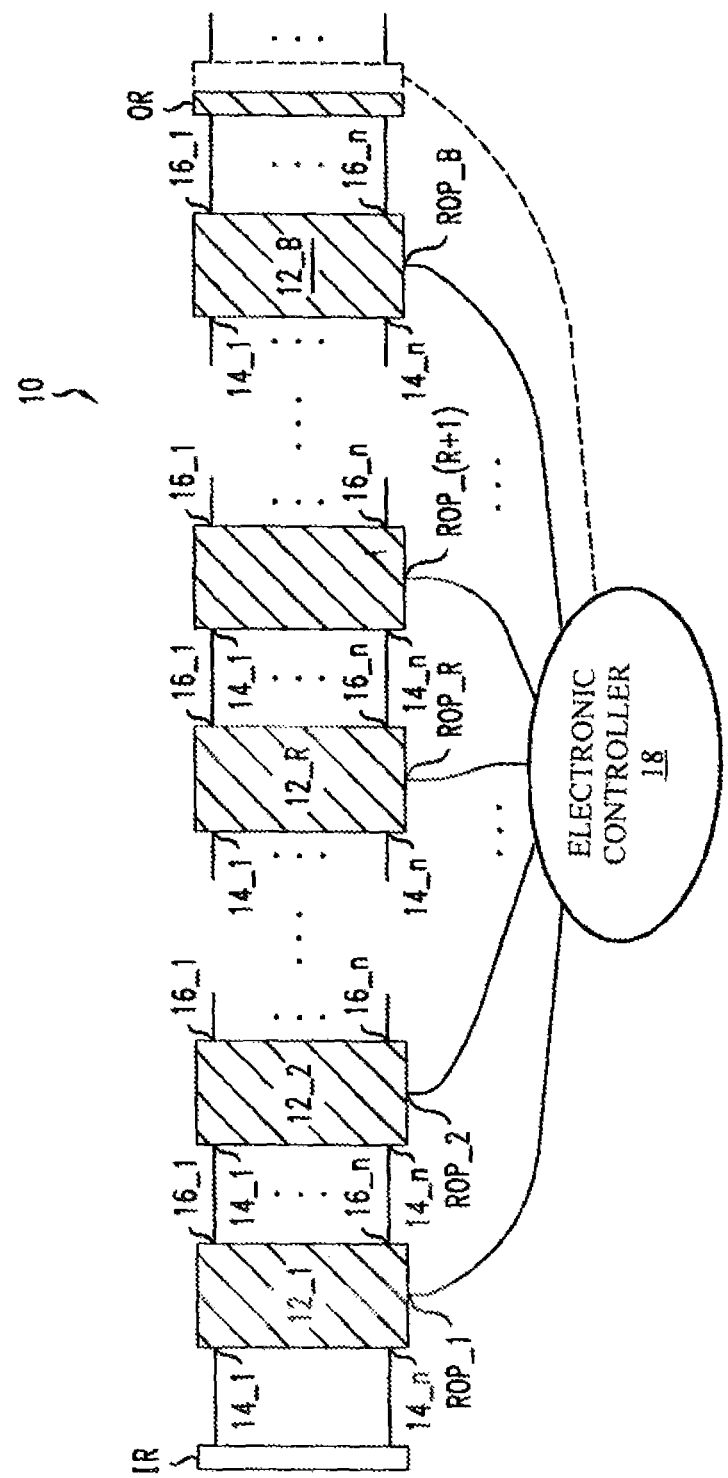
FIG. 1 is a block diagram for an apparatus configured to measure a syndrome of quantum redundancy coded states, which have undergone physical processing capable of generating errors therein.

In the Figures, the relative dimensions of some features may be exaggerated to more clearly illustrate apparatus therein.

Herein, various embodiments are described more fully by the Figures and the Detailed Description of Illustrative Embodiments. Nevertheless, the inventions may be embodied in various forms and are not limited to the specific embodiments described in the Figures and the Detailed Description of the Illustrative Embodiments.

DETAILED DESCRIPTION OF ILLUSTRATIVE EMBODIMENTS

The books *Quantum Error Correction and Fault Tolerant Quantum Computing* by Frank Gaitan (Taylor & Francis 2008) and *Quantum Computation and Quantum Information* by Micahel A. Nielson and Isaac L. Chuang (Cambridge 200)) are incorporated herein by reference in their entirety.

U.S. provisional patent application No. 61/752,646, which was filed on Jan. 15, 2013, is incorporated herein by reference in its entirety.

Herein, the word state refers to a physical entity rather than an abstract condition unless otherwise specified. For example, an n-qubit state of physical objects refers to the physical entity of physical objects, e.g., a collection of n ions, which has been suitably prepared. The physical entity of the state may be produced, stored, transported, or measured and may, e.g., carry a representation of n qubits.

As already stated some error-correction schemes are based on the syndrome of the physically processed, quantum redundancy coded states. The syndrome is a binary-valued multi-component vector whose value identifies a probable specific error, e.g., the most probable error, in such a state from a set of possible errors therein. For example, the syndrome may be sufficient to identify errors to such physically processed quantum redundancy coded states when the errors are single qubit errors. That is, the value of the syndrome may be sufficient to identify an error under the assumption that there is an error in a single one of the preselected number of qubits of the quantum redundancy encoded state. Based on the determining value of the syndrome, the error-correction processing may invert the identified most probable error by passing the physically processed quantum redundancy coded state through a quantum circuit of quantum gates.

Such schemes for error-correction often fail when the determination incorrectly identifies the value of the syndrome of a physically processed quantum redundancy coded state. Also, many hardware devices to measure values of the syndrome are prone to providing erroneous values, because the hardware devices are based on quantum circuits of error-prone elementary quantum gates. Thus, increasing the reliability of determinations of the syndrome can improve the performance of error-correction, which is based on determined values of the syndrome.

One scheme to increase the reliability of a determination of a value of the syndrome involves making a set of measurements of the value of the syndrome on a physically processed quantum redundancy coded state and then, defining the value of the syndrome for that state to be the most frequently measured one of the values of the set. For example, the most frequently measured one of the values may be determined by a majority rule. According to a majority rule, the determined value would have been the measured value for the physically processed, quantum redundancy coded state most of the time. Such a scheme is believed by the inventor to reduce the probability of errors in determinations of the syndrome, but such a scheme is also believed by the inventor to typically use a large amount of measurement hardware to produce modest reductions in occurrences of such errors.

Various embodiments of apparatus and methods improve reliabilities of determinations of values of the syndrome for physically processed, quantum redundancy coded states. The improved reliabilities can be higher than those produced by the above-mentioned methods involving multiple measurements of the syndrome and/or can use less measurement hardware to determine values of the syndrome to the same reliability as the methods involving multiple measurements of the syndrome.

FIG. 1 illustrates an apparatus 10 that is configured to determine the syndrome of a physically processed, quantum redundancy coded states. The quantum redundancy coded state has n physical objects; each of the physical objects carries a corresponding single measurable qubit of information. The quantum redundancy coded states are produced by coherently mixing a preselected quantum state of the (n−k) physical objects with an initial quantum state carrying k qubits of information. The previous physical processing of the quantum redundancy coded states may have produced error(s) therein.

In various quantum states, the physical objects carrying individual qubits of information may take various forms, e.g., photons, confined ions, confined atoms, and/or edge or other excitations of a fractional quantum Hall effect droplet of charge carriers. Persons of ordinary skill in the relevant arts would understand how to make such physical objects, to quantum code information on such physical objects, to coherently mix such quantum states, and to read information stored in such quantum states. Some such methods and apparatus, which are configured to perform such functions, may described in the above-incorporated book by Frank Gaitan and/or in the above-incorporated book by Micahel A. Nielson et al.

In FIG. 1, the apparatus 10 includes an input register IR for a quantum state and an output register OR for a quantum state. The input register IR is able to receive and store the n physical objects of the physically processed, quantum redundancy coded state of n qubits. The output register is configured to store and transmit n physical objects of the same received state after processing in the apparatus 10.

The apparatus 10 has a sequence of hardware measurement devices 12_1, . . . , 12_B. Each hardware measurement device 12_1-12_B has a first array of n input ports 14_1-14_n and second array of n output ports 16_1-16_n. The intermediate output ports 16_1 to 16_n of the R-th of the hardware measurement devices 12_R connect, in a one-to-one manner, to intermediate input ports 14_1 to 14_n of the next one of the hardware measurement devices 12_(R+1) of the sequence. The sequence receives the n-physical objects of the physically processed, quantum redundancy coded state from the input register IR via the input ports 14_1-14_n of the first hardware measurement device 12_1 of the sequence, and transmits said physical objects to the output register OR via the output ports 16_1-16_n of the last of the hardware measurement device 12_B of the sequence.

In the sequence, each hardware measurement device 12_1-12_B is configured to measure a binary value, which is indicative of either:

a) a corresponding bit of the syndrome of the physically processed, quantum redundancy coded state, which was received by the apparatus 10 at the input ports 14_1-14_n;

or b) a parity check bit for the same syndrome, which other of the hardware measurement devices 12_1-12_B are configured to measure.

One or more of the hardware measurement devices 12_1-12_B measure(s) parity check bit(s) of the syndrome, and other(s) of the hardware measurement devices 12_1-12_B measure(s) bit(s) of the syndrome. In some embodiments, such measurements of parity check bits may support multiple parity checks of a measured value of the syndrome. In some embodiments, the measurements may include a measurement of each bit of the syndrome by, at least, one of the hardware measurement devices 12_1-12_B of the sequence. In different embodiments, measurements of specific bit(s) of the syndrome and/or specific parity check bit(s) for such measurements may be performed by ones of the hardware measurement devices 12_1-12_B located at different positions in the sequence.

The apparatus 10 also includes an electronic controller 18, which is configured to receive the measured bit(s) of the syndrome and the measured parity check(s) thereof from the hardware measurement devices 12_1-12_B. Indeed, each hardware measurement device 12_1-12_b has a result output port ROP_1-ROP_B from which the measured values of such a parity check bit or an ordinary bit of the syndrome is transmitted to the controller 18. The electronic controller 18 determines a value for the syndrome of a received physically processed, quantum redundancy coded state based on measured bit values received from the result output ports ROP_1-ROP_B of the hardware measurement devices 12_1-12_B.

The electronic controller 18 applies error-correction to the received measurements of the bits of the syndrome based on the received measured parity check bit(s) for said measurements of bits of the syndrome. For example, the error-corrected value may be based on direct measurements of each bit of the syndrome by some of the hardware measurement devices 12_1-12_B and direct measurement(s) of one or more parity check bits for the measured value of the bits of the syndrome by a remainder of the hardware measurement devices 12_1-12_B.

In such embodiments, the electronic controller 18 may also error correct the measured values of the bits of the syndrome via error-correction of linear redundancy coding, e.g., based on a linear block code or a systematic linear block code. In such methods the electronic controller 18 may treat the syndrome as a binary information vector. Then, the controller may apply conventional techniques to identify a syndrome from the measured value of the syndrome, i.e., based on the measured parity check bit(s). Based on the measured values of the syndrome, the controller 18 can identify the most probable errors in the measured values of the syndrome, e.g., single bit errors, and correct such errors in the measured values of the syndrome.

In some embodiments of the apparatus 10, each hardware measurement device 12_1-12_B includes a quantum circuit of elementary quantum gates. In different ones of the hardware measurement devices 12_1-12_B, the quantum circuits may differ. In particular, each hardware measurement device 12_1-12_B has a quantum circuit configured to measure a corresponding bit of the syndrome or a parity check bit of the measured syndrome.

In some embodiments, each hardware measurement device 12_1-12_B includes a corresponding quantum circuit of quantum gates. Each quantum circuit corresponds to an element of the stabilizer group for the quantum redundancy coding scheme, and the element of the stabilizer group defines the type of bit output at the result output port ROP_1-ROP_B of the hardware measurement device 12_1-12_B.

The description of such embodiments of the hardware measurement devices 12_1-12_B is simple via a representation of a qubit as a spin having 2 states, i.e., |0> and |1>. In such a representation, the initial quantum states and quantum redundancy coded states are represented as complex superpositions of multi-spin states. Each initial quantum state is a complex superposition of states of k such spins. Each quantum redundancy coded state is a complex superposition of states of n such spins. Here, a state of p spins is a state in the direct product space of the fundamental 2-state spin. A complex superposition is a sum of such direct product states in which each state of the sum is weighted by a complex factor.

In such a spin-representation, the processing of a quantum redundancy coded state may be represented by the application of a matrix on the corresponding n-spin state. Such matrices are writable as sums of direct products of the 2×2 matrices of a set V. The set V includes the 2×2 identity matrix and the 2×2 Pauli matrices, i.e., I, $\sigma_x$, $\sigma_y$, and $\sigma_z$. Indeed, physical processing of a quantum redundancy code state may produce a fundamental error, which is representable by the action of an operator in the n-dimensional direct product space of the 2×2 matrices of V.

In addition, a one-to-one correspondence exists between the 2×2 matrices of V and 2-component binary vectors. This correspondence will simplify the description of quantum circuits of the illustrated embodiments for the hardware measurement devices 12_1-12_B of FIG. 1. The correspondence is defined as follows.

$I \leftrightarrow 0, 0$;
$\sigma_x \leftrightarrow 1, 0$;
$\sigma_z \leftrightarrow 0, 1$; and
$\sigma_y \leftrightarrow 1, 1$.

The 2×2 Pauli matrices are well known to be defined as follows:

$$\sigma_x = \begin{bmatrix} 0 & 1 \\ 1 & 0 \end{bmatrix},$$

$$\sigma_y = \begin{bmatrix} 0 & -i \\ i & 0 \end{bmatrix},$$

and $$\sigma_z = \begin{bmatrix} 1 & 0 \\ 0 & -1 \end{bmatrix}.$$

The above correspondence defines a function U from the space of 2-dimensional binary vectors to the set V. The function U is defined as follows:

$U(0,0)=I$, $U(1,0)=\sigma_x$, $U(0,1)=\sigma_z$, and $U(1,1)=\sigma_y$.

The function U provides a simple description of a correspondence between fundamental error operators, and 2n-dimensional binary vectors, i.e., vectors of the form $(a_{11}, a_{12}, a_{21}, a_{22}, \ldots, a_{n1}, a_{n2})$, wherein each $a_{ij}$ is in $\{0, 1\}$. Each fundamental error operator E has the form:

$U(a_{11},a_{12}) \otimes \ldots \otimes U(a_{n1},a_{n2})$ for some 2n-dimensional binary vector $(a_{11}, a_{12}, \ldots, a_{n1}, a_{n2})$. Thus, the correspondence is defined as follows:

$E = U(a_{11},a_{12}) \otimes \ldots \otimes U(a_{n1},a_{n2}) \Leftrightarrow (a_{11}, a_{12}, \ldots, a_{n1}, a_{n2})$ To further illustrate this correspondence, two examples are shown below for n=3 and 4.

The error $\sigma_x \otimes I \otimes \sigma_z = U(1, 0) \otimes U(0, 0) \otimes U(0, 1) \Leftrightarrow (1, 0, 0, 0, 0, 1)$.

The error $I \otimes \sigma_z \otimes \sigma_x \otimes \sigma_y = U(0, 0) \otimes U(0, 1) \otimes U(1, 0) \otimes U(1, 1) \Leftrightarrow (0, 0, 0, 1, 1, 0, 1, 1)$. The above-described correspondence also gives a correspondence between elements of the stabilizer group, which are fundamental error operators, and a subset of the 2-dimensional binary vectors. In particular, each element $g_i$ of the stabilizer group for the quantum redundancy coding scheme corresponds to the 2n-dimensional binary vector $(a_{11}(i) \, a_{12}(i), \ldots, a_{n1}(i), a_{n2}(i))$ for which the element $g_i = U(a_{11}(i) \, a_{12}(i)) \otimes \ldots \otimes U(a_{n1}(i), a_{n2}(i))$.

The 2n-dimensional binary vectors $(a_{11}(i) \, a_{12}(i), \ldots, a_{n1}(i), a_{n2}(i))$ corresponding to elements $g_i$ also form a representation of the stabilizer group. In this representation, the group operation is binary addition of the corresponding 2n-dimensional binary vectors. In particular, a group element $g_m = g_i \times g_j$ is represented by:

$(a_{11}(m)a_{12}(m), \ldots, a_{n1}(m),a_{n2}(m)) = (a_{11}(i)+a_{11}(j),a_{12}(i)+(a_{12}(j), \ldots, a_{n1}(i)+a_{n1}(j),a_{n2}(i)+a_{n2}(j))$.

This representation is abelian as is the stabilizer group itself.

A person of ordinary skill in the relevant arts would be readily able to determine the stabilizer group from a selected quantum redundancy coding scheme. Some descriptions of examples of quantum redundancy coding schemes and stabilizer groups thereof may be found in the above-incorporated books of Frank Gaitan and Micahel A. Nielson et al.

The basis elements of the stabilizer group describe quantum circuits of elementary quantum gates usable to directly measure the syndrome of a physically processed, quantum redundancy coded state. Other element(s) of the stabilizer group describe quantum circuit(s) of elementary quantum gates useable to directly measure parity check bits for the measured value of the syndrome of such a physically processed, quantum redundancy coded state. Below, the descriptions of such quantum circuits are based on the above correspondence.

In particular, each basis element $g_j$ of the stabilizer group defines a quantum circuit of quantum elementary gates configured to measure a corresponding bit $s_j$ of the syndrome of a physically processed, quantum redundancy coded state. To measure the bit $s_j$ of the syndrome, the physically processed, quantum redundancy coded state is passed through the quantum circuit for the corresponding basis element $g_j$ of the stabilizer group. Thus, each bit of the syndrome may be measured by passing the physically processed, quantum redundancy coded state through a series of such quantum circuits as long as the series includes, at least, one such quantum circuit corresponding to each basis element of the stabilizer group.

Other elements $g_q$ of the stabilizer group define quantum circuits of elementary quantum gates configured to measure corresponding parity check bits $p_q$ for the measured value of the syndrome. To measure the parity check bit $p_q$, a physically processed, quantum redundancy coded state is passed through the quantum circuit for the corresponding element $g_q$ of the stabilizer group. For example, to determine a parity check bit for measured bits $s_f$ and $s_h$ of the syndrome, the physically processed, quantum redundancy coded state is passed through a quantum circuit corresponding to $g_q = g_f \times g_h$. Here, $g_f$ is the basis element of the stabilizer group corresponding to the quantum circuit configured to measure the bit $s_f$ of the syndrome, and $g_h$ is the basis element of the stabilizer group corresponding to the quantum circuit configured to measure bit $s_h$ of the syndrome. Finally, "×" is the multiplication operation of the stabilizer group.

Figure 2:
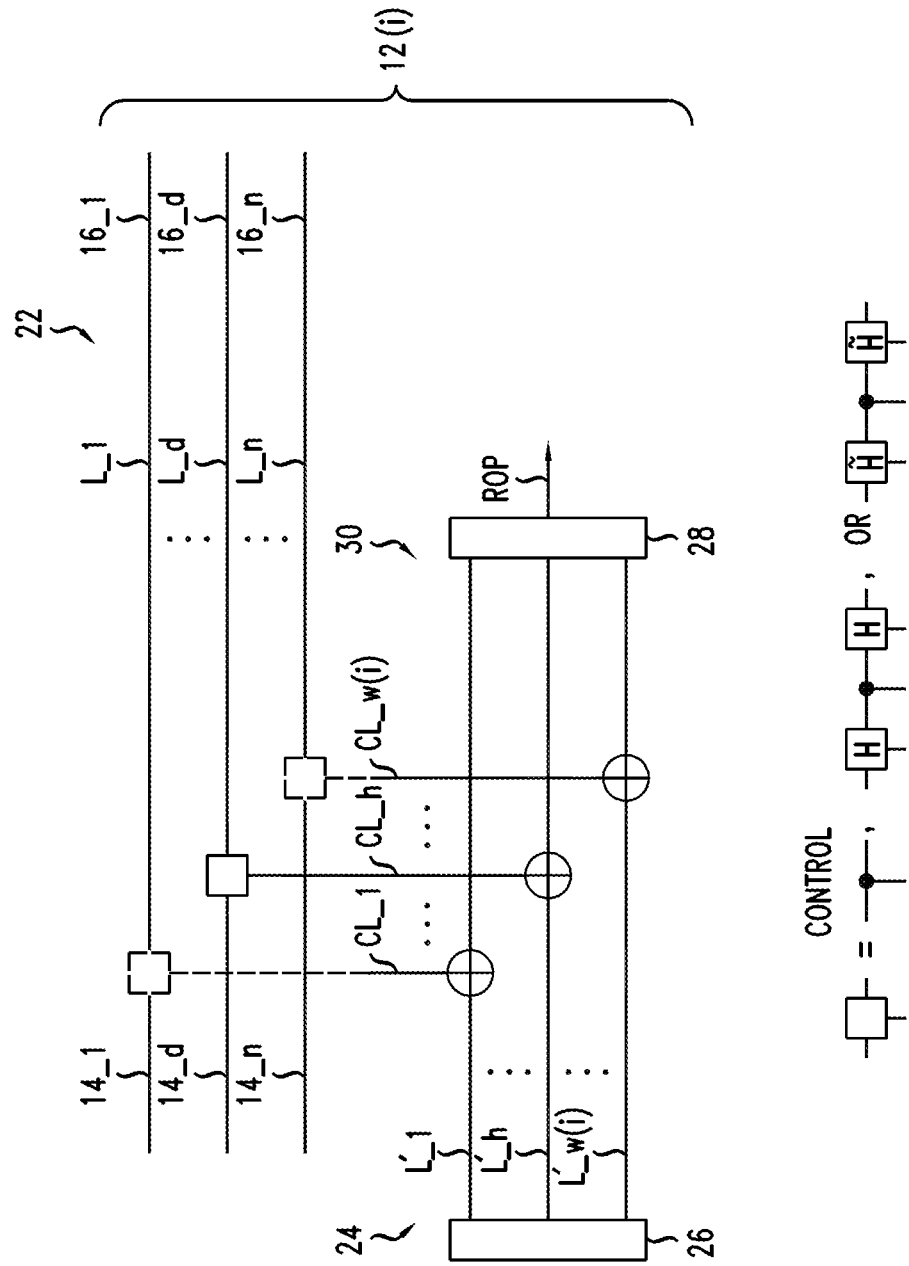
FIG. 2 is a block diagram of a quantum circuit, e.g., which may form one of the hardware measurement devices of FIG. 1.

FIG. 2 illustrates an embodiment of the quantum circuit 12(i) corresponding to the element $g_i$ of the stabilizer group, e.g., one of the hardware measurement devices 12_1-12_B of FIG. 1. The element $g_i$ has a corresponding 2n-dimensional binary vector $(a_{11}(i)\ a_{12}(i), \ldots, a_{n1}(i), a_{n2}(i))$, which defines an integer w(i). In particular, the integer w(i) the number of pairs $(a_{f1}(i), a_{f2}(i))$ not equal to (0, 0) for all values of the index f. The integer w(i) defines several properties of the quantum circuit 12(i) as described below.

The quantum circuit 12(i) has a primary physical channel 22 comprising qubit connection lines L_1, ..., L_n, a measurement section 24, and w(i) control lines CL_1, ..., C_w(i). Each connection line L_1-L_n communicates a qubit of a received quantum state from one of the input ports 14_1, ..., 14_d, ..., 14_n to one of the output ports 14_1, ..., 14_d, ..., 14_n, e.g., to operate on the qubit. The primary physical channel 22 controls a secondary physical channel 30 of the measurement section 24 such that transmission of a preselected quantum state through the secondary physical channel 30 produces a state whose properties measure a bit of the syndrome for the quantum state received at the input ports 14_1-14_n or a parity check bit for said measurement of the syndrome.

Herein, a connection line, e.g., any of lines L_1-L_n and L'_1 to L'_w(i), is a portion of a quantum gate or a portion of a series of quantum gates to transfer a qubit of a state between an input port and output port.

The measurement section includes an input register 26 to store a preselected quantum state, i.e., an ancilla state of w(i) qubits, an output measurement device 28, and the secondary physical channel 30 having w(i) qubit connection lines L'_1, ..., L'_w(i) to transmit the qubits of the preselected quantum state between the input register 26 and the output measurement device 28. Each of the connection line L'_1-L'_w(i) of the secondary physical channel 30 is controlled by one of the connection lines L_1-L_n of the primary physical channel 22, i.e., via one of the control lines CL_1-CL_w(i). For clarity, the control structure is indicated by a box on the connection line L_d of the primary physical channel 22. The box connects to the connection line L'_h of the secondary physical channel 30 via the control line CL_h. On the other connection lines L_1-L_n of the primary physical channel 22 have small dashed boxes thereon to indicate locations where such control connections may be located. Among the n connection lines L_1-L_n, w(i) will have such inter-line interaction structures at the locations indicated by the small dashed boxes. Any of the [n-w(i)] other connection line L_1-L_n of the primary channel do (does) not connect to a two-line elementary quantum gate.

The control lines CL_1-CL_w(i) indicate the presence of two-line quantum gates that connect w(i) of the connection lines L_1-L_n of the primary physical channel 22 to the connection lines L'_1-L'_w(i) of the secondary physical channel 30.

The output region 28 is configured to measure a value of each of the w(i) qubits of the quantum state received from the secondary physical channel 30 and is configured to transmit a result signal for the measured parity of a sum of measured values of the w(i) qubits of that received quantum state. The result signal is transmitted to a result output port, e.g., one of the result output ports ROP_1-ROP_B of FIG. 1. The result signal is the value of a measured bit of the syndrome or a parity check bit for the measured syndrome.

Various structures and methods for making and using the lines L_1-L_n, L'_1-L'_w(i), and CL_1-CL_w(i); the elementary quantum gates; the register 26: and measurement region 28 would be easily understood by persons of ordinary skill in the relevant arts based on the present disclosure. In addition, descriptions of some such structures and methods may be provided, e.g., in one or both of the above-incorporated books of Frank Gaitan and Micahel A. Nielson et al.

In a hardware measurement device, the pattern of the elementary quantum gates that couple the lines L_1-L_n and L'_1-L'_w(i) of the primary and secondary physical channels 22, 30, is fixed by the form of 2n-dimensional binary vector $(a_{11}(i)\ a_{12}(i), \ldots, a_{n1}(i), a_{n2}(i))$, which corresponds to the element $g_i$. For example, the d-th line L_d from the top of the primary physical channel 22 connects to the h-th line L'_h of the secondary physical channel 30 via an elementary quantum gate. The form of that elementary quantum gate is fixed by the value of the pair $(a_{d1}(i), a_{d2}(i))$. For the various values of this pair, the elementary quantum gate defined as follows:

0) For $(a_{=d1}(i), a_{d2}(i)) = (0, 0)$, the quantum gate acts as the identity operator, i.e., no quantum gate.

1) For $(a_{d1}(i), a_{d2}(i)) = (0, 1)$, the quantum gate is a control-not (CNOT) gate, whose control is from the line L_d in the primary physical channel 22.

2) For $(a_{d1}(i), a_{d2}(i)) = (1, 0)$, the quantum gate is a sequence of a Hadamard gate (H), a CNOT gate, and a H gate where the H gates and the control of the CNOT gate are on the line L_d of the primary physical channel 22.

3) For $(a_{d1}(i), a_{d2}(i)) = (1, 1)$, the quantum gate is a sequence of a discrete x-axis rotation of $-\pi/4$ gate ($\tilde{H}$), a CNOT gate, and a $\tilde{H}$ gate where the $\tilde{H}$ gate and the control of the CNOT gate are on the line L_d of the primary physical channel 22.

The various above-mentioned elementary quantum gates operate as follows. The H gate operates on a single spin state |j>, i.e., the qubit on the line L_d of the primary physical line L_d, according to:

$$H|j> = [|0> + (-1)^j|1>].$$

The CNOT gate operates on a two-spin states |i, j>, i.e., qubits the lines L_d and L'_h, according to:

$$CNOT|i,j> = |i, i+j>.$$

Here, "+" indicates addition mod 2. For the CNOT gate, the controlling qubit, I, is on the line L_d of the primary physical channel 22, and the controlled qubit, j, is on the line L'_h of the secondary physical channel 30. The $\tilde{H}$ gate operates on a single spin state |j> on the line L_d of the primary physical channel 22 and is defined by:

$$\tilde{H}|j> = \exp(-i\pi\sigma_x/4)|j>.$$

In the quantum circuit, the form of the secondary physical channel 30 and the preselected quantum state in the register 26 are fixed by the 2n-dimensional binary vector $(a_{11}(i)\ a_{12}(i), \ldots, a_{n1}(i), a_{n2}(i))$ corresponding to the element $g_i$ of the stabilizer group. First, as already mentioned, the secondary physical channel 30 has w(i) of the qubit connection lines L_1-L_w(i), i.e., a separate line for each two-state quantum gate of the quantum circuit. Finally, the preselected quantum state, which is stored in the register 26, and is transmitted to the secondary physical channel 30, is the Shor quantum state |A> of w(i) qubits. The Shor quantum state |A> is defined by:

$$|A\rangle = 2^{[-w(i)-1]/2} \sum_{A(e)} |A(e)\rangle$$

Here, the sum over the quantum states A(e), which includes all direct products of w(i) spin states, i.e., w(i) qubit states, having even parity.

FIGS. 3, 4, 5, and 6 illustrate quantum circuits 12(1), 12(2), 12(3), 12(4), which correspond to basis elements $g_1$, $g_2$, $g_3$, and $g_4$, respectively, of a stabilizer group G for a quantum redundancy coding scheme in which n=5. The correspondences between the basis elements $g_1$, $g_2$, $g_3$, and $g_4$ and 10-dimensional (10D) binary vectors are given by:
- $g_1 \leftrightarrow$ (1, 0, 0, 1, 0, 1, 1, 0, 0, 0),
- $g_2 \leftrightarrow$ (0, 0, 1, 0, 0, 1, 0, 1, 1, 0),
- $g_3 \leftrightarrow$ (1, 0, 0, 0, 1, 0, 0, 1, 0, 1), and
- $g_4 \leftrightarrow$ (0, 1, 1, 0, 0, 0, 1, 0, 0, 1).

Each of the elements $g_1$, $g_2$, $g_3$, and $g_4$ has a weight "w(i)" equal to 4 so that the Shor states will have 4 qubits.

Figure 3:
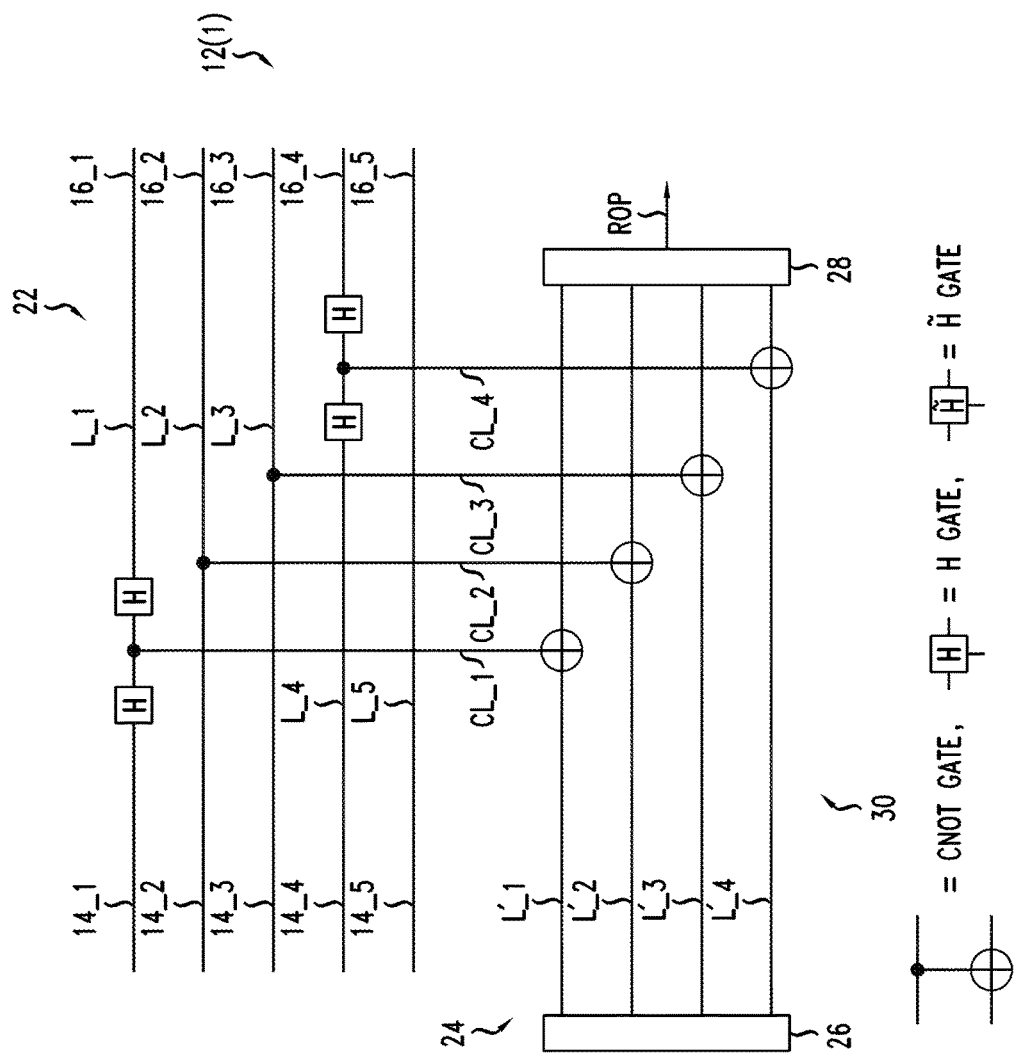
FIGS. 3, 4, 5, and 6 are block diagrams of examples of quantum circuits for basis elements of a stabilizer group G and are embodiments of the hardware measurement devices of FIG. 1 for directly measuring the bits of the syndrome for one quantum redundancy coding scheme.

FIG. 3 illustrates the quantum circuit 12(1) corresponding to the element $g_1$ of the stabilizer group. The structure of the quantum circuit 12(1) is derived from the 10D binary vector (1, 0, 0, 1, 0, 1, 1, 0, 0, 0) as follows:
1. In the 10D binary vector for $g_1$, the left-most bit pair is (1, 0). For the pair (1, 0), a sequence of an H gate, a CNOT gate, and an H gate connect the top line of the primary physical channel 22 to the top line of the secondary physical channel 30.
2. In the 10D binary vector for $g_1$, the second bit pair is (0, 1). For the pair (0, 1), a CNOT connects the next-to-top line of the primary physical channel 22 to the next-to-top line of the secondary physical channel 30.
3. In the 10D binary vector for $g_1$, the third bit pair is also (0, 1). For the pair (0, 1), a CNOT connects the third line of the primary physical channel 22 to the third line of the secondary physical channel 30.
4. In the 10D binary vector for $g_1$, the fourth bit pair is (1, 0). For the pair (1, 0), a sequence of an H gate, a CNOT gate, and an H gate connect the fourth line of the primary physical channel 22 to the fourth line of the secondary physical channel 30.
5. In the 10D binary vector for $g_1$, the fifth or right-most bit pair is (0, 0). For the pair (0, 0), there is no connection between the bottom line of the primary physical channel 22 and the secondary physical channel 30. The fifth qubit does not participate in this measurement.

Figure 4:
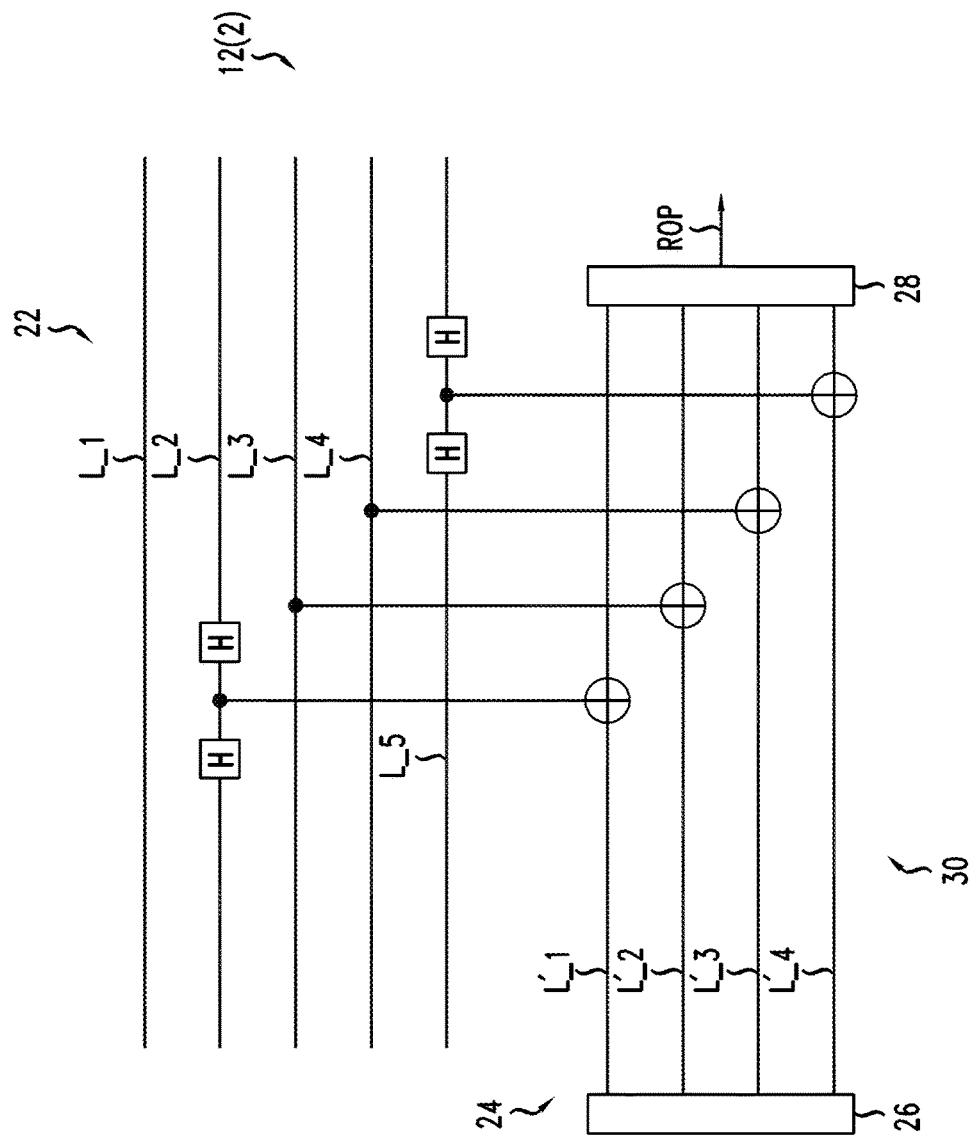
Figure 5:
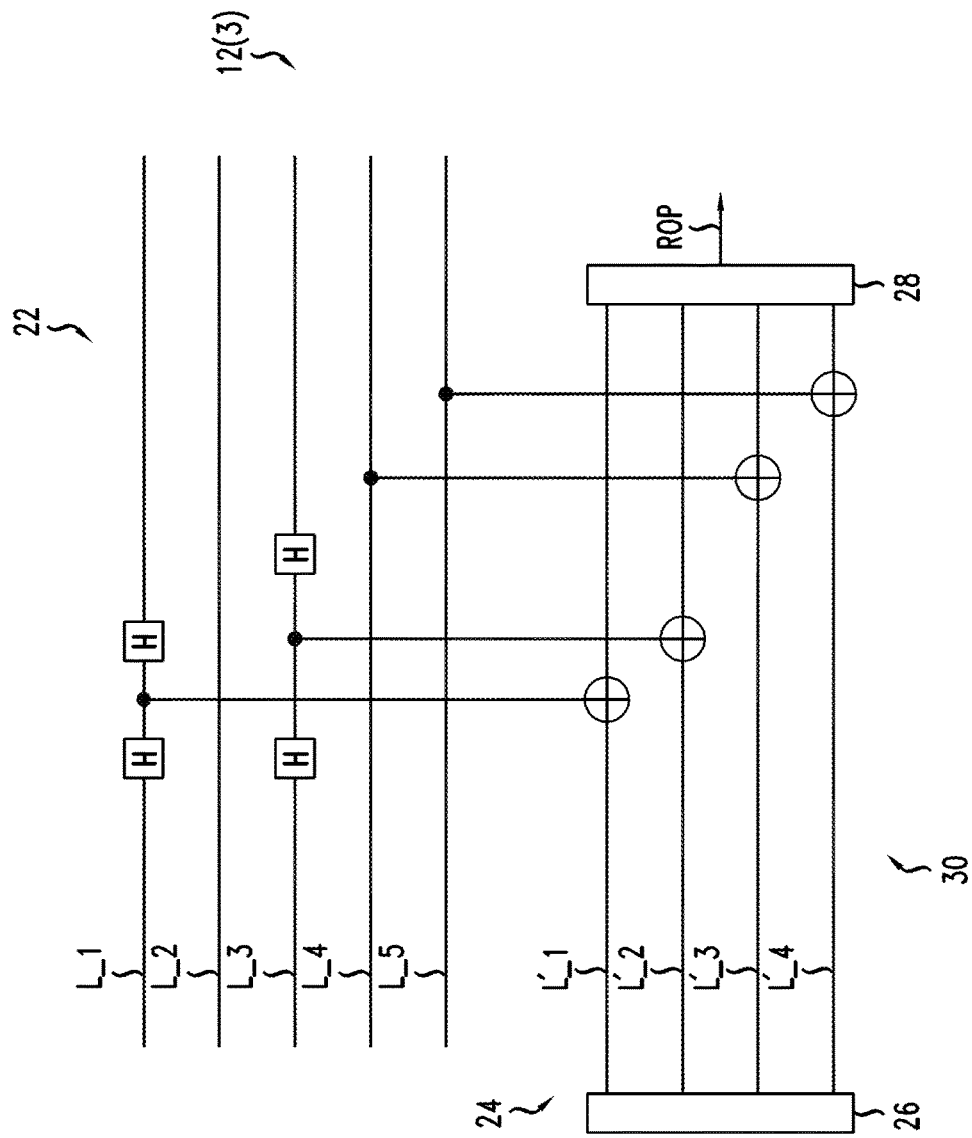
Figure 6:
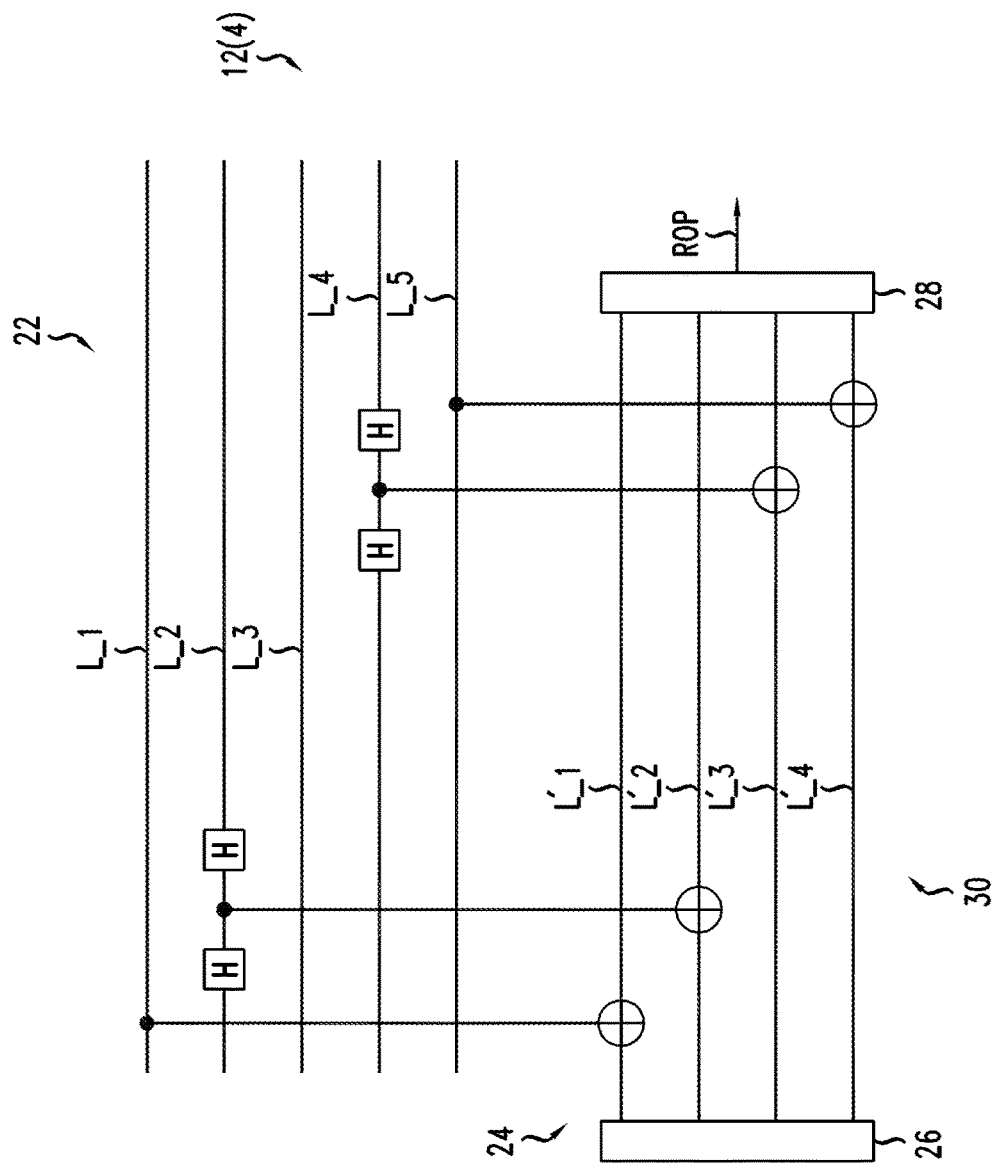

FIGS. 4, 5, and 6 illustrate the quantum circuits 12(2), 12(3), and 12(4), which correspond to the respective basis elements $g_2$, $g_3$, and $g_4$. The quantum circuits 12(2), 12(3), 12(4) can be derived from the 10D binary vectors corresponding to the group elements $g_2$, $g_3$, and $g_4$ in a manner similar to the above derivation of the quantum circuit 12(1) from the 10D binary vector corresponding to the group elements $g_1$.

In some embodiments, the electronic controller 18 may be configured to use linear coding to error-correct measurements of the bits of the syndrome, e.g., via linear block coding. For example, in the above example, the quantum circuits 12(1)-12(4) corresponding to the basis elements $g_1$, $g_2$, $g_3$, and $g_4$ of the stabilizer group G measured bits $s_1$, $s_2$, $s_3$, and $s_4$ of the syndrome for the physically processed, quantum redundancy coded state. The electronic controller 18 may be configured to error-correct the set of measured values of the bits $s_1$, $s_2$, $s_3$, and $s_4$ of the syndrome via linear block coding techniques. In linear block coding, the parity check bits are defined to be linear combinations of the information bits. Here, the information bits are the syndrome bits $s_1$, $s_2$, $s_3$, and $s_4$. Thus, in the above example, such linear block coding may use parity check bits $p_1$-$p_8$, which are the following linear combinations of the syndrome bits $s_1$, $s_2$, $s_3$, and $s_4$:

$p_1 = s_1 + s_3$, $p_2 = s_2 + s_3$, $p_3 = s_1 + s_2$, $p_4 = s_1 + s_2 + s_4$, $p_5 = s_1 + s_3 + s_4$, $p_6 = s_3 + s_4$, $p_7 = s_3 + s_2 + s_3 + s_4$, $p_8 = s_2 + s_4$.

Such a selection of the parity check bits corresponds to a linear code C, which has the following generator matrix:

$$\begin{bmatrix} 1 & 0 & 0 & 0 & 1 & 0 & 1 & 1 & 1 & 0 & 1 & 0 \\ 0 & 1 & 0 & 0 & 0 & 1 & 1 & 1 & 0 & 0 & 1 & 1 \\ 0 & 0 & 1 & 0 & 1 & 1 & 0 & 0 & 1 & 1 & 1 & 0 \\ 0 & 0 & 0 & 1 & 0 & 0 & 0 & 1 & 1 & 1 & 1 & 1 \end{bmatrix} \quad (2)$$

The above parity check bits may be measured by quantum circuits corresponding to elements of the stabilizer group, which are products of the basis elements $g_1$, $g_2$, $g_3$, and $g_4$. For example, since the parity check bit $p_3$ is equal to $s_1 + s_2$, the quantum circuit for measuring $p_3$ corresponds to element $g_1 \times g_2$ of the stabilizer group. But, the 10D binary vector corresponding to $g_1 \times g_2$ is the sum of the 10D binary vectors corresponding to $g_1$ and $g_2$. Thus, the quantum circuit for measuring $p_3$ corresponds to:

(1,0, 0,1, 0,1, 1,0, 0,0)+(00 10 01 01 10)=(1,0, 1,1, 0,0, 1,1, 1,0).

Similar, the quantum circuit for measuring $p_2$, which is $s_2 + s_3$, is the 10D binary vector corresponding to $g_2 \times g_3$. Thus, the quantum circuit for measuring $p_2$ corresponds to:

(0,0, 1,0, 0,1, 0,1, 1,0)+(1,0, 0,0, 1,0, 0,1, 0,1)=(1,0, 1,0, 1,1, 0, 0, 1,1).

Figure 7:
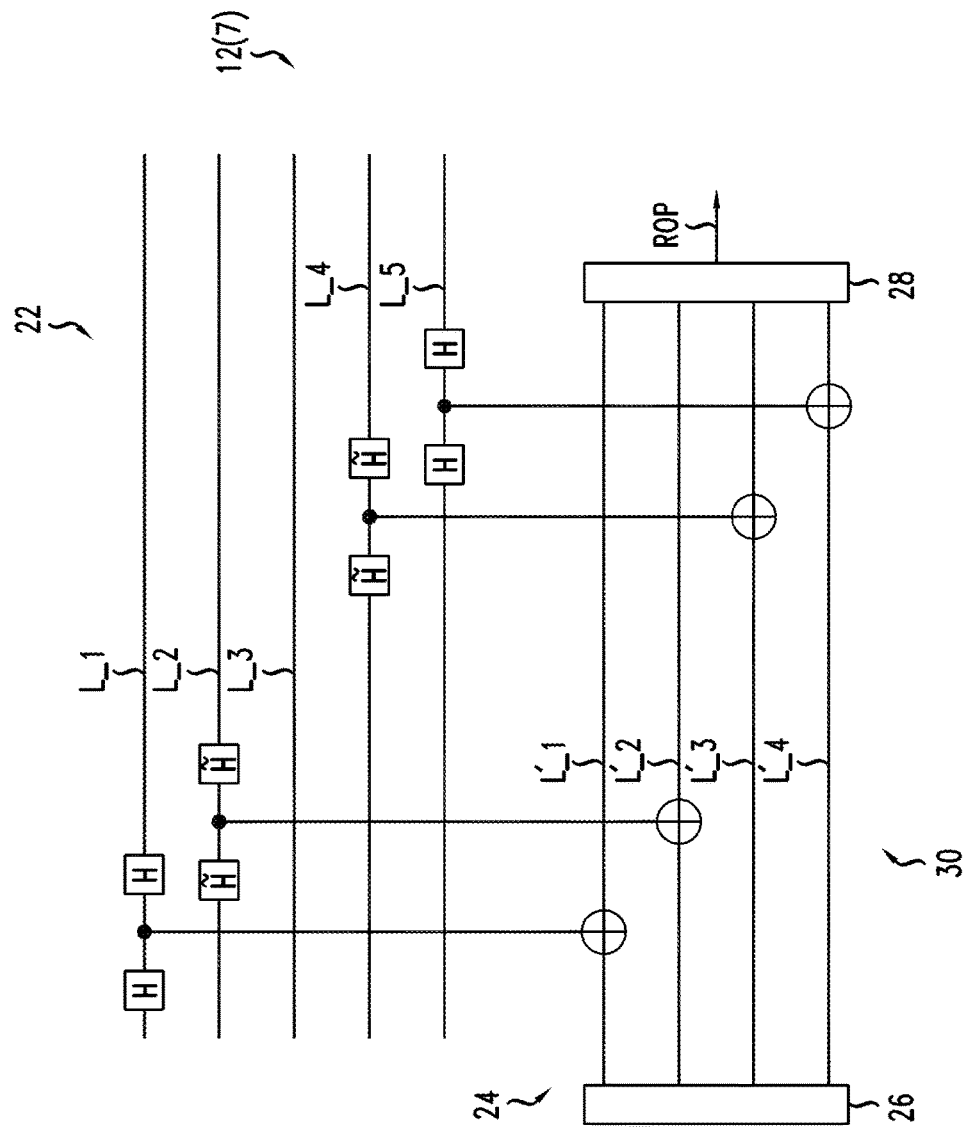
FIGS. 7 and 8 are block diagrams of examples of quantum circuits for non-basis elements of the same stabilizer group G and are embodiments of hardware measurement devices of FIG. 1 for directly measuring parity bits for the measured syndrome in the same quantum redundancy coding scheme.
Figure 8:
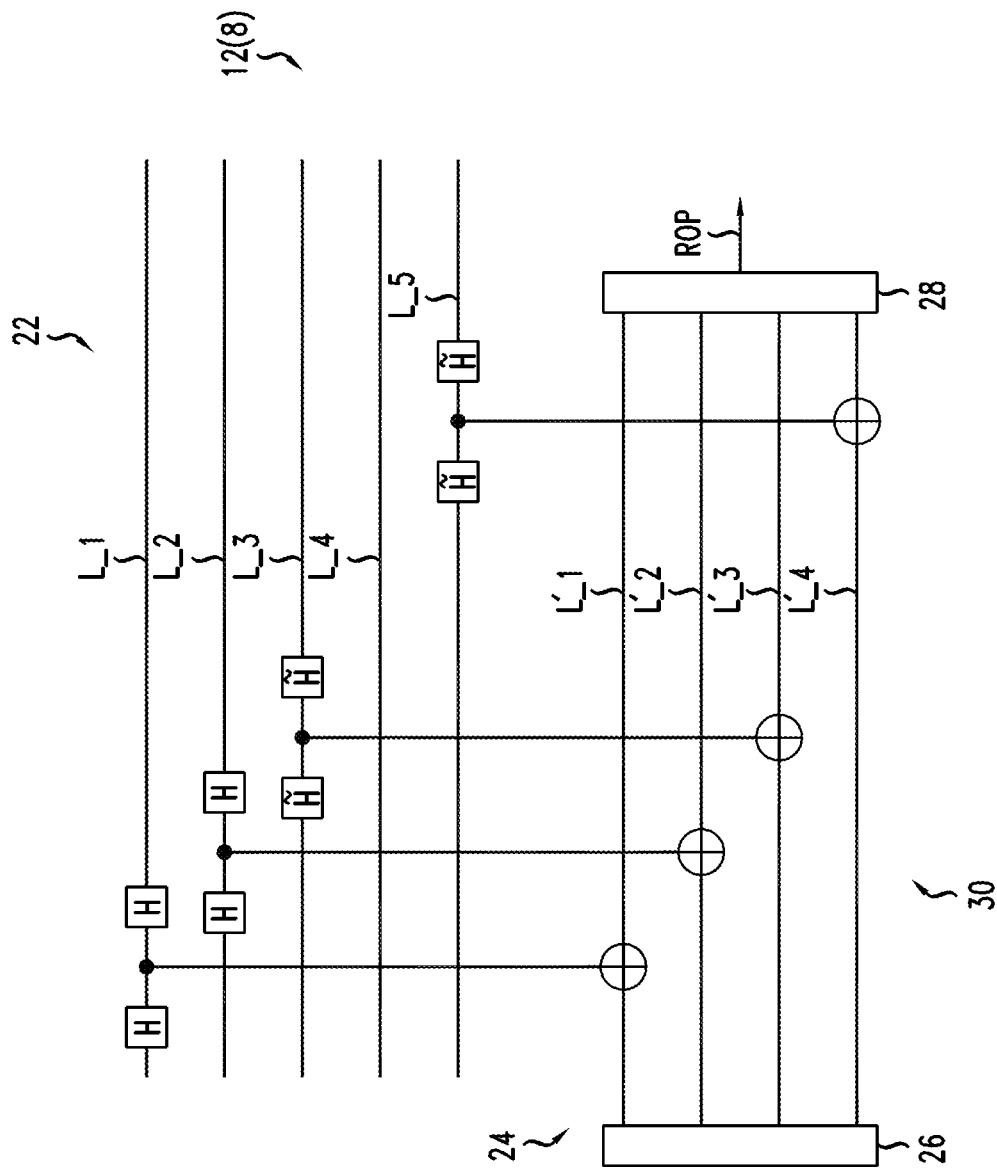

FIGS. 7 and 8 illustrate respective quantum circuits 12(7) and 12(8) for directly measuring $p_3$ and $p_2$, respectively.

Based on the above description, a person of ordinary skill in the relevant arts would be able to construct quantum circuits for directly measuring each of the above-listed parity check bits $p_1$-$p_8$.

In an embodiment of the apparatus 10 of FIG. 1, which included such quantum circuits, the electronic controller 18 may be configured, e.g., to error-correct measured values of the syndrome based on the linear C code. In particular, if the measured values of the syndrome bits $s_1$-$s_4$ and the parity check bits $p_1$-$p_8$ are all correct, the vector ($s_1$, $s_2$, $s_3$, $s_4$, $p_1$, $p_2$, $p_3$, $p_4$, $p_5$, $p_6$, $p_7$, $p_8$) is a codeword of the code C. On the other hand, if one or more of these measured bit values is incorrect then this vector is a not a codeword. In such a situation, the electronic controller 18 may be configured to find the mostly likely codeword ($v_1$, $v_2$, $v_3$, $v_4$, $v_5$, $v_6$, $v_7$, $v_8$, $v_9$, $v_{10}$, $v_{11}$) in C and may be configured to form the syndrome as ($v_1$, $v_2$, $v_3$, $v_4$). For instance, the electronic controller 18 may be configured to find the closest codeword of C to the vector $(s_1, s_2, s_3, s_4, p_1, p_2, p_3, p_4, p_5, p_6, p_7, p_8)$ as follows:

$$v = (v_1, v_2, v_3, v_4, v_5, v_6, v_7, v_8, v_9, v_{10}, v_{11})$$

$$= \mathrm{argmin}_{v \in C} dist(v, (s_1, s_2, s_3, s_4, p_1, p_2, p_3, p_4, p_5, p_6, p_7, p_8)).$$

Here, the function dist(V,W) is the Hamming distance between the vectors V and W.

In other embodiments, the electronic controller 18 of FIG. 1 may estimate the probability of a decoding error, $P_j$, for each bit $s_j$ of the syndrome and the error probability, say $Pr_1$, for each bit $p_1$ and use these probabilities to perform soft-decision decoding of C. For instance, the electronic controller 18 may be configured to perform a trellis based soft-decision decoding of C. The probabilities $P_j$ and $Pr_1$ may depend, e.g., on the Hamming weights of binary vectors of the corresponding elements of the stabilizer group.

Whereas the apparatus 10 of FIG. 1 serially measures bits of the syndrome of a physically processed, quantum redundancy coded state and measures one or more parity check bits for said set of measured bits of the syndrome, said measurements may be performed differently. Indeed, other embodiments may perform such measurements in a parallel manner a serial manner, or a mixed parallel and serial manner.

Figure 9:
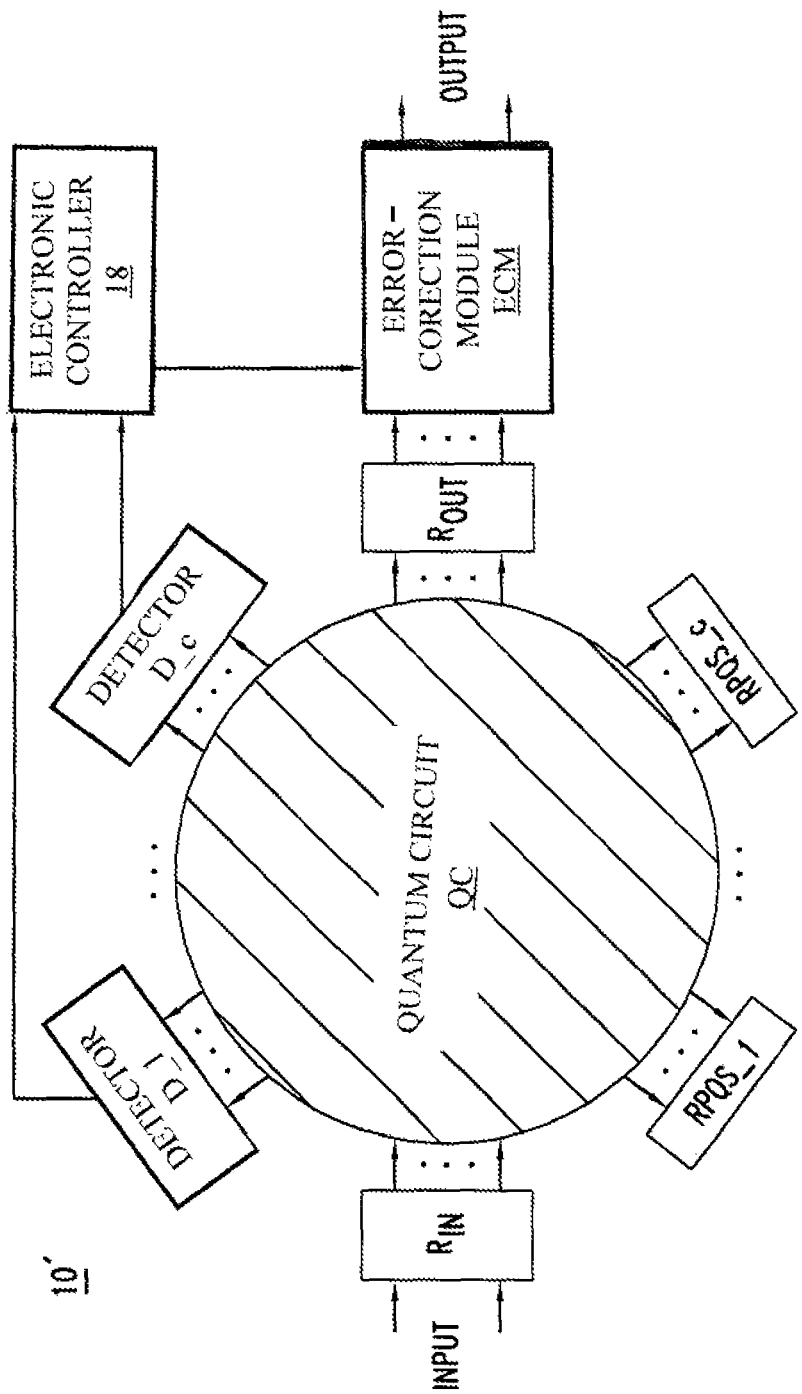
FIG. 9 is a block diagram illustrating an apparatus that uses a quantum circuit and a set of preset quantum states to provide error-correction of a measured syndrome of a received quantum redundancy coded state.

FIG. 9 illustrates another apparatus 10' that is configured to apply error-correction to measured bits of the syndrome of an n-qubit physical state, which is received at an input marked INPUT in FIG. 9. The received n-qubit physical state was previously prepared by quantum redundancy coding an initial quantum state of k physical objects and subsequently, physical processing the quantum redundancy coded state of n physical objects in a manner capable of causing errors therein.

The apparatus 10' includes an input register $R_{IN}$, an output register $R_{OUT}$, auxiliary registers RPQS_1-RPQS_c for c corresponding preset quantum states of physical object(s), a quantum circuit QC, c detectors of quantum states D_1-D_c, and an electronic controller 18. In some embodiments, the apparatus may also include an optional error-correction module ECM.

FIG. 9 schematically indicates various connections between components. First, connections between ports of the registers $R_{IN}$, $R_{OUT}$, RPQS_1-RPQS_c and ports of the quantum circuit QC, and between ports of the detectors D_1-D_c and ports of the quantum circuit QC are indicated by arrowed lines. Second, connections for transmitting signals between the electronic controller 18 and the detectors D_1-D_c and for transmitting signals between the electronic controller 18 and the optional error-correction module ECM are indicated by arrowed lines.

The input register $R_{IN}$ is connected to store the n-qubit physical state, which is received at an input marked INPUT in FIG. 9. The input register $R_{IN}$ transmits the received n-qubit physical state to n input ports of the quantum circuit QC via n output ports of the input register $R_{IN}$.

The output register $R_{OUT}$ has n input ports connected to n output ports of the quantum circuit QC so that the output register $R_{OUT}$ can receive and store the n-qubit physical state, which the quantum circuit QC previously received from input register $R_{IN}$. The output register $R_{IN}$ transmits the n-qubit physical state to an output, which is marked OUPUT in FIG. 9, or outputs said state to an optional error-correction module ECM in embodiments having such a module.

Each of the one or more auxiliary registers RPQS_1-RPQS_c stores a preset quantum state and is configured to transmit the preset quantum state, which is stored therein, via output ports to a corresponding set of input ports of the quantum circuit QC.

The quantum circuit QC is configured to process the received quantum states in a manner that transforms the preset quantum states based on the n-qubit physical state received from the input register $R_{IN}$. The quantum circuit QC transmits each of the one or more transformed preset quantum states to a corresponding one of the detectors D_1-D_c. The quantum circuit QC outputs to the output register $R_{OUT}$ the same n-qubit quantum state, which was received from the input register $R_{IN}$. For example, inside the quantum circuit QC, the received n-qubit physical state may operate control nodes of quantum gates and/or undergo one or more internal transformations that are inverted inside the quantum circuit QC.

Each detector D_1-D_c makes a measurement of a value(s) of qubit(s) of the transformed preset quantum state received thereat. Based on the measured value(s) of the qubits, the detector transmits to the electronic controller 18 a signal. The signal corresponds either to a measured value of a corresponding bit of the syndrome for the n qubit quantum state, which was received at the input (INPUT), or a measured value of a parity check bit for measured bits of the syndrome. One or more of the detectors D_1-D_c measures parity check bit(s) for the measured bits of the syndrome. Typically, others of the detectors D_1-D_c measure bits of the syndrome.

The electronic controller 18 receives the signals for measured values of bit(s) of the syndrome and/or measured value(s) of parity check bit(s) from the detectors D_1-D_c. From the measured values, the electronic controller 18 determines a probable value of the syndrome for the n-qubit physical state received at the input marked INPUT. For example, the electronic controller 18 may apply one or more techniques of linear redundancy coding to error-correct the measured value(s) of bit(s) for the syndrome based on the measured value(s) of parity check bit(s). The electronic controller 18 may also send a control signal to the optional error-correction module ECM, wherein the control signal indicates the probable value of the syndrome as determined by the electronic controller 18.

The optional error-correction module ECM operates on the n-qubit physical state to remove an error therein and transmits the error-corrected physical state to the output, which is marked OUTPUT in FIG. 9. In particular, the error-correction module passes the n-qubit physical state through a quantum circuit to invert the error therein, wherein the form of the error-inversion is indicated by the control signal received from the electronic controller 18. Thus, the error-correction is based on the value of the syndrome as determined by the electronic controller 18.

In FIG. 9, the apparatus 10' may prepare the various transformed preset quantum states in parallel, in series, or partially in parallel and partially in series.

Finally, other embodiments of apparatus that measure bits of the syndrome of a received and physically processed, quantum redundancy coded state and measure one or more parity check bit(s) for said set of measured bits of the syndrome may use other quantum circuits. Said quantum circuits may have different patterns of quantum gates and/or may use some different quantum gates. For example, some such quantum circuits may even couple more than 2 qubits.

Figure 10:
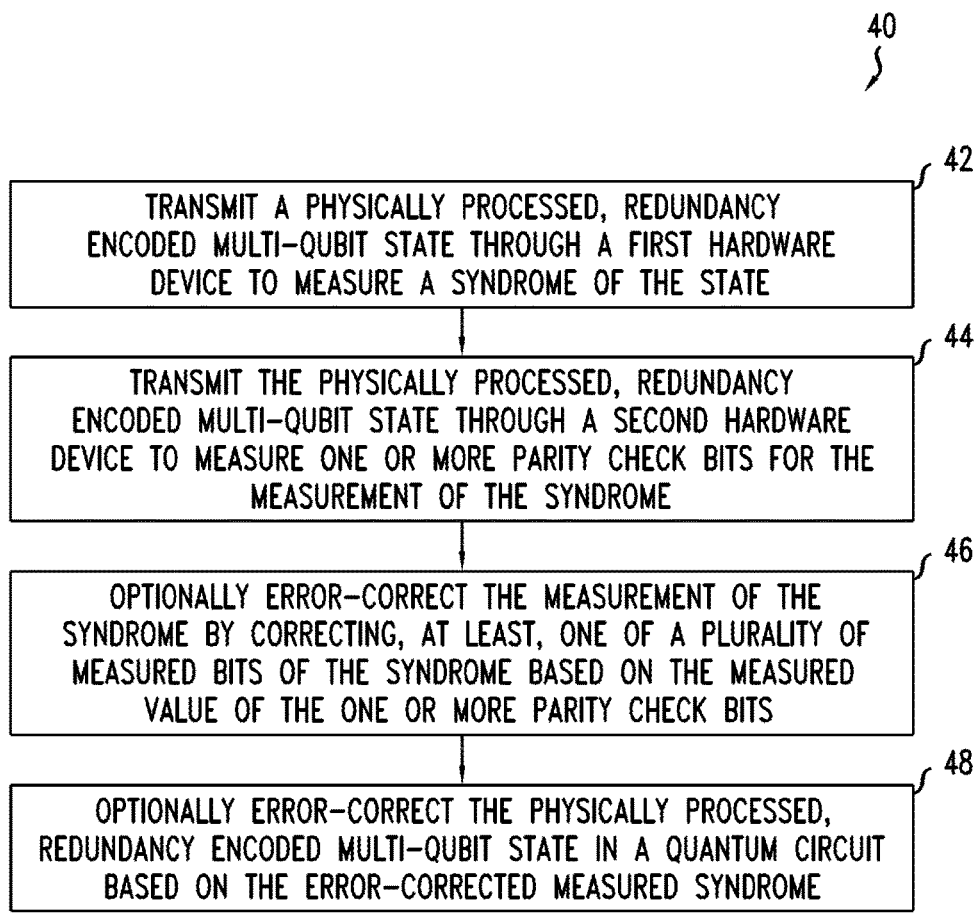
FIG. 10 is a flow chart illustrating a method of handling a physically processed, redundancy encoded multi-qubit state, e.g., in the apparatus of FIGS. 1 and 9.

FIG. 10 illustrates a method 40, which involves measuring a syndrome of a physically processed, redundancy encoded multi-qubit state, e.g., in the apparatus 10, 10' of FIGS. 1 and 9.

The method 40 includes transmitting a physically processed, redundancy encoded multi-qubit state through a first hardware device to measure a syndrome of the physically processed, redundancy encoded multi-qubit state (step 42). For example, the step 42 may be performed in some of the hardware measurement devices 12_1-12_B of FIG. 1 or in the quantum circuit QC of FIG. 9. The first hardware measurement device may, e.g., include one or more first sequences of quantum gate circuits.

The method 40 also includes transmitting the physically processed, redundancy encoded multi-qubit state through a second hardware device to measure one or more parity check bits for the measurement of the syndrome (step 44). For example, the step 42 may be performed in the remaining hardware measurement devices 12_1, . . . , 12_B of FIG. 1 or in other portions of the quantum circuit QC of FIG. 9. For example, the second hardware measurement device may include one or more second sequences of quantum gate circuits.

The method 40 may optionally include error-correcting the measured syndrome by correcting, at least, one of a plurality of measured bits of the syndrome based on the measured value of the one or more parity check bits (step 46). For example, such a correction of the measured syndrome may be performed by the electronic controller 18 of FIGS. 1 and 9.

The method 40 may optionally including error-correcting the physically processed, redundancy encoded multi-qubit state in a quantum circuit based on the error-corrected measured syndrome. For example, such error-correction may be performed in the error correction module ECM of FIG. 9.

Some embodiments of apparatus and methods described herein may use methods and/or apparatus described in U.S. patent application Ser. No. 13/912,654, which is concurrently being filed on Jun. 7, 2013. For example, some embodiments may be suitable when constructed such that the linear block code is a low-density generator-matrix code. U.S. patent application Ser. No. 13/912,654 is incorporated herein by reference in its entirety Herein, a parity check bit is not measured via separate measurements of the bits for which the parity of the sum is checked by the parity check bit. For example, a quantum circuit device configured to measure such a parity check bit may obtain the value of the parity check bit from a measurement on a single quantum state of entangled objects. Such a quantum circuit device does not obtain the value of the parity check bit from separate measurements of multiple quantum states, wherein the separate measurements measure the values of the underlining bits whose sum can be parity checked by the value of a parity check bit.

Other embodiments include various methods of operating any of the apparatus described herein.

The electronic devices describe herein may be implemented fully in hardware or in hardware configured to operate specific software, e.g., computer devices configured to execute a machine or computer readable program of executable commands for performing steps of any of the methods described herein. Such a machine or computer executable program may be stored in a non-transitory manner on any conventional digital data storage medium, e.g., an electronic memory, a magnetic hard disk, or an optical data storage disk.

The Detailed Description of the Illustrative Embodiments and drawings merely illustrate embodiments of the inventions. It will be appreciated that based on the present disclosure, persons of ordinary skill in the relevant arts will be able to readily devise other apparatus and method that, although not explicitly described or shown herein, are included within the claimed inventions. Furthermore, all examples recited herein are principally intended to be only for pedagogical purposes and are to be construed as being without limitation to claimed inventions. Moreover, all statements herein reciting principles, aspects, and embodiments are intended to encompass equivalents thereof.

Herein, a recitation that an element has feature B or feature C is satisfied if any of below cases 1, 2, and 3 are true. In case 1, the element has feature B, but does not have feature C. In case 2, the element has feature C, but does not have feature B. In case 3, the element has both feature B and C.

What is claimed is:

1. An apparatus, comprising:
   an input register connected to receive and store a physical state of n qubits;
   a plurality of auxiliary registers, each auxiliary register of the plurality being configured to transmit a preset state of one or more qubits;
   a quantum circuit being constructed to transform the preset states based on the physical state received from the input register and to output the physical state to an output register; and
   a plurality of detectors, each detector of the plurality being connected to receive a corresponding one of the transformed preset states from the quantum circuit and being configured to produce a value by measuring one or more qubits of the corresponding received one of the transformed preset states; and
   wherein the quantum circuit is configured to form the transformed preset states such that the produced values measure bits of a syndrome of the physical state and such that at least one of the produced values measures a parity check bit for the measured bits of the syndrome.

2. The apparatus of claim 1, further comprising a controller being configured to receive the values from the detectors and being configured to error-correct one of the produced values that measures a bit of the syndrome based on the value that measures a parity check bit.

3. The apparatus of claim 2, further comprising an error-correction module being configured to receive the physical state from the output register and to error-correct the received physical state based on an error-corrected value of the syndrome produced by the electronic controller.

4. The apparatus of claim 1, wherein the quantum circuit is configured to serially produce the transformed preset states.

5. The apparatus of claim 1, wherein the quantum circuit is configured to transform, at least, two of the preset states in parallel.

* * * * *